United States Patent
Blain Christen et al.

(10) Patent No.: US 11,121,281 B2
(45) Date of Patent: Sep. 14, 2021

(54) SYSTEMS AND METHODS FOR LIGHT DIRECTION DETECTION MICROCHIPS

(71) Applicants: Jennifer M. Blain Christen, Tempe, AZ (US); Jebb Remelius, Pittsfield, MA (US)

(72) Inventors: Jennifer M. Blain Christen, Tempe, AZ (US); Jebb Remelius, Pittsfield, MA (US)

(73) Assignee: Arizona Board of Regents on Behalf of Arizona State University, Tempe, AZ (US)

( * ) Notice: Subject to any disclaimer, the term of this patent is extended or adjusted under 35 U.S.C. 154(b) by 0 days.

(21) Appl. No.: 16/923,935

(22) Filed: Jul. 8, 2020

(65) Prior Publication Data

US 2021/0013359 A1    Jan. 14, 2021

Related U.S. Application Data

(60) Provisional application No. 62/871,658, filed on Jul. 8, 2019.

(51) Int. Cl.
*H01L 27/15* (2006.01)
*H01L 29/161* (2006.01)
(Continued)

(52) U.S. Cl.
CPC ...... *H01L 31/173* (2013.01); *H01L 31/02019* (2013.01)

(58) Field of Classification Search
CPC ............. H01L 31/173; H01L 31/02019; H01L 31/02327; H01L 27/14–14893;
(Continued)

(56) References Cited

U.S. PATENT DOCUMENTS

| 10,170,407 B2 | 1/2019 | Smith et al. |
| 10,249,741 B2 | 4/2019 | Smith et al. |
| 2010/0187405 A1* | 7/2010 | Arao ................ H01L 27/14643 250/208.2 |

(Continued)

FOREIGN PATENT DOCUMENTS

| WO | 2015168515 A1 | 11/2015 |
| WO | 2021007442 A1 | 1/2021 |

OTHER PUBLICATIONS

Song, H et al., "A CMOS Self-Powered Monolithic Light DirectionSensor with SAR ADC", 2014 27th IEEE International System-on-Chip Conference (SOCC) (Las Vegas, NV, Sep. 2-5, 2014), Date Added to IEEE Xplore: Nov. 2014, pp. 58-62 <DOI:10.1109/SOCC.2014.6948900>.

(Continued)

*Primary Examiner* — Calvin Y Choi
(74) *Attorney, Agent, or Firm* — Polsinelli PC

(57) ABSTRACT

Embodiments of an improved light-direction detection (LDD) device are described herein. The LDD device includes a substrate and at least one predefined structure formed along the substrate by stacking metal layers, contacts, and vias available in the manufacturing process of the device. The predefined structure is formed along a photodiode pair to collectively define an optical sensor configured to detect direction of incident light without need for off-chip components. The device accommodates light direction detection in two or more orthogonal planes.

18 Claims, 13 Drawing Sheets

(51) Int. Cl.
*H01L 31/12* (2006.01)
*H01L 31/153* (2006.01)
*H01L 33/00* (2010.01)
*H01L 31/173* (2006.01)
*H01L 31/02* (2006.01)

(58) Field of Classification Search
CPC . H01L 31/145–153; H01L 31/165–173; H01L 31/141–143; H01L 31/161–164; G01S 17/00–95
USPC .......................................................... 257/84
See application file for complete search history.

(56) References Cited

U.S. PATENT DOCUMENTS

| | | | |
|---|---|---|---|
| 2011/0042556 A1* | 2/2011 | Natsuaki | G01J 3/0208 250/226 |
| 2016/0181182 A1 | 6/2016 | Smith et al. | |
| 2017/0059563 A1 | 3/2017 | Smith et al. | |
| 2017/0179682 A1* | 6/2017 | Ishii | G01J 1/0411 |

OTHER PUBLICATIONS

Wang, H et al., "A selfpowered single-axis maximum power direction tracking system with an on-chip sensor", Solar Energy, Feb. 2015 [available online Dec. 2014], vol. 112, pp. 100-107 <DOI:10.1016/j.solener.2014.11.019>.

Wang, H. et al., "CMOS self-powered monolithic light-directionsensor with digitalized output", Optics Letters, Apr. 2014, vol. 39, No. 9, pp. 2618-2621 <DOI:10.1364/OL.39.002618>.

Wang, H. et al., "On-chip sensor for light direction detection", Optics Letters, Nov. 2013, vol. 38, No. 22, pp. 4554-4557 <DOI:10.1364/OL.38.004554>.

Wang, H. et al., "Variable self-powered light detection CMOS chip with real-time adaptive tracking digital output based on a novel on-chip sensor", Optics Express, Sep. 2017, vol. 25, No. 20, p. 24138-24147 <DOI:10.1364/OE.25.024138>.

Welch, D. et al., "Fully differential current-mode MEMS dual-axis optical inclination sensor", Sensors and Actuators A: Physical, Apr. 2013 [available online Dec. 2012], vol. 192, pp. 133-139 <DOI:10.1016/j.sna.2012.12.001>.

Mohammad, et al., J. SoL Energy Eng. 135, 011013 (2013).

Pineda, et al., in 38th Photovoltaic Specialists Conference, IEEE, 2012, pp. 2905-2910.

Mobasser, et al., in Proceedings of 2003 IEEE Conference on Control Applications, IEEE, 2003, vol. 2, pp. 1483-1487.

U.S. Pat. No. 5,517,017, May 14, 1996, Yamada et al.
U.S. Pat. No. 5,400,386, Mar. 21, 1995, Amemiya et al.
U.S. Pat. No. 5,264,910, Nov. 23, 1993, Hill.
U.S. Pat. No. 5,264,691, Nov. 23, 1993, Hegyi.

* cited by examiner

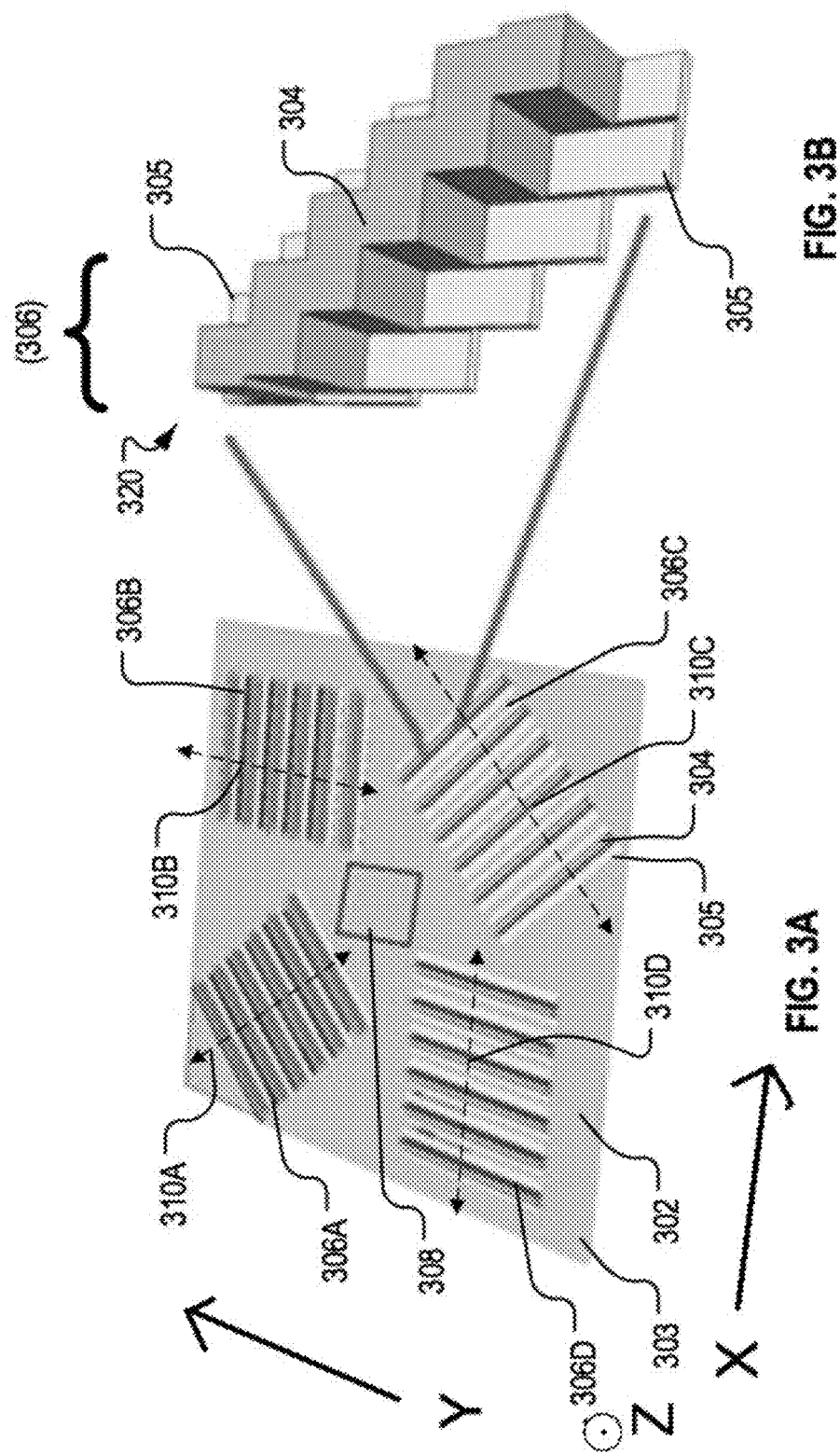

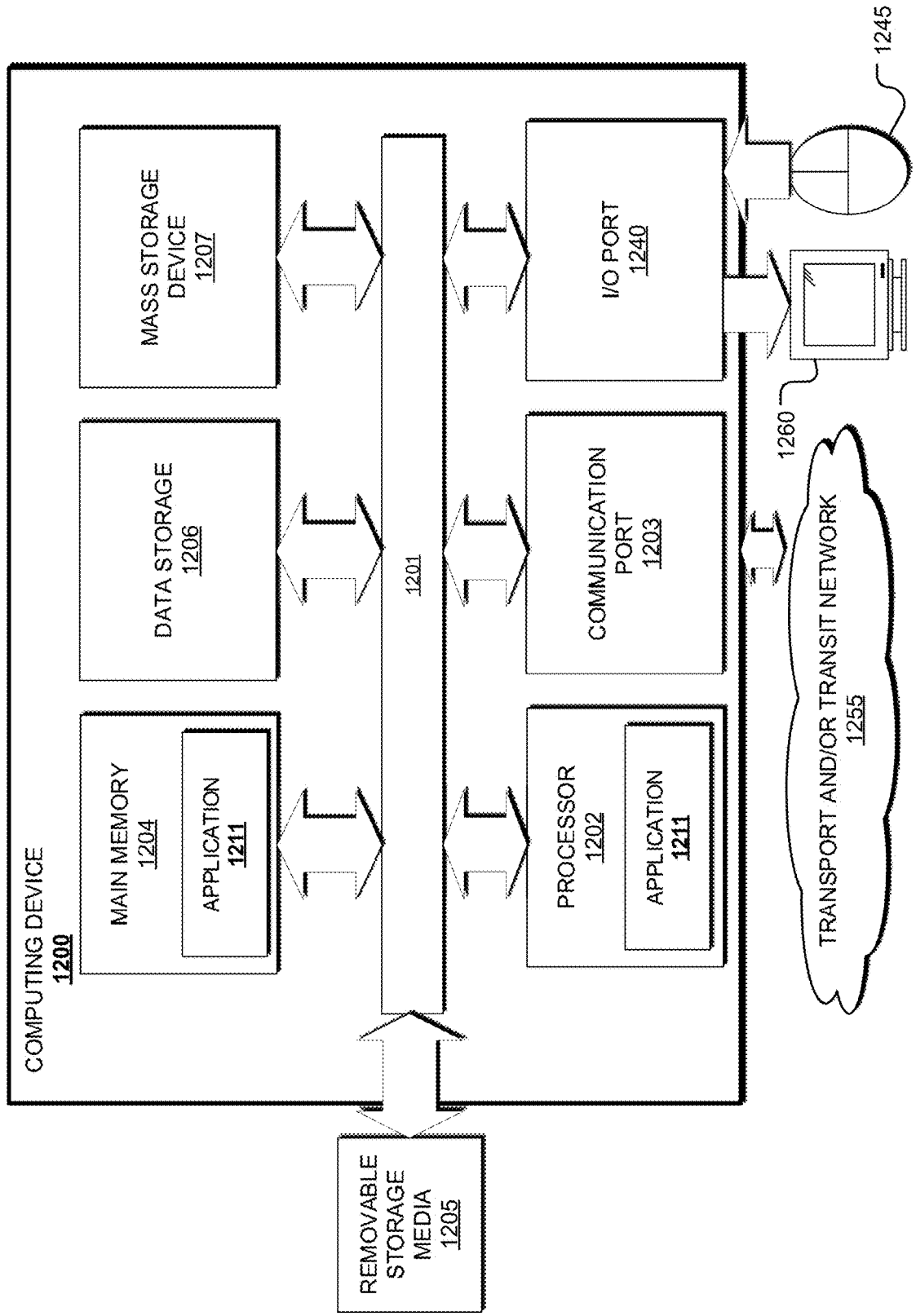

SYSTEMS AND METHODS FOR LIGHT DIRECTION DETECTION MICROCHIPS

CROSS REFERENCE TO RELATED APPLICATIONS

The present document is a non-provisional application that claims benefit to U.S. provisional patent application Ser. No. 62/871,658 filed on Jul. 8, 2019, which is herein incorporated by reference in its entirety.

FIELD

The present disclosure generally relates to implementations of integrated circuits including optical sensors; and more particularly, to light direction detection microchips and methods thereof, which may be implemented for motion-capture systems, or other applications.

BACKGROUND

Existing motion-capture systems may detect infrared (IR) signals with expensive digital cameras having one or more lenses. The IR signals may be emitted from active markers or a ring of LEDs surrounding each lens which cause light to be bounced off of retro-reflective passive markers affixed to the object being tracked. These motion-capture systems may require at least three cameras to be effective. Some systems operate with more than six cameras, and some systems are scaled up to even 300 cameras.

However, currently available motion-capture systems may only record three-dimensional (3D) positions of single points, describing an object's motion in left-to-right, up-and-down or forward-and-backward. Data with six degrees of freedom (6 DoF), including rotational movement about the x-, y- and z-axes, is often highly valuable for body position analysis in medicine, in virtual reality mechanics, and in reality-based animation, among other applications. In order to approximate 6 degrees of freedom, a motion-capture technician may currently need to apply and track three or more passive markers to get a single 6 DoF description.

Problems can occur with camera-based motion capture when the three markers are close together physically or have apparent angles, relative to individual cameras, that are very nearly the same. Further issues can arise if the cluster of markers is too far or too close to any of the cameras. Messy merging of these passive markers often results, which contaminates and degrades 6 DoF matrix data output. After recording data, each passive marker must be individually labeled, and picked-up again if momentarily dropped. Additionally, even when working with very accurate motion-capture data, animations produced from the captured data often get trapped in the "uncanny valley" where realism is not truly felt and audiences may react negatively. Part of today's failure to create realism occurs because the passive markers used to capture an actor's face may only yield 3 DoF data. For example, it may be physically impossible to provide enough adjacent markers to track features such as the curl of the lip in 6 DoF. There are hybridized motion-capture systems that pair passive markers with inertial sensors, but such systems may have increased complexity and suffer from so-called "double integration" errors.

It is with these observations in mind, among others, that various aspects of the present disclosure were conceived and developed.

BRIEF DESCRIPTION OF THE DRAWINGS

FIG. 3A is perspective view of one embodiment of an LDD microchip suitable for light-direction detection along multiple planes.

FIG. 3B is an enhanced view of one embodiment of an LDD microchip as described herein suitable for light-direction detection with a measurement layout including "zig-zag" or stepped metal wall CMOS construction on main diagonal portions.

FIG. 10 is a simplified block diagram of an exemplary computing device which may be implemented with various systems and embodiments described herein.

Corresponding reference characters indicate corresponding elements among the view of the drawings. The headings used in the figures do not limit the scope of the claims.

DETAILED DESCRIPTION

Summary and Technical Introduction

The present disclosure relates to integrated circuits, and in particular, to light direction detection (LDD) microchips and improvements thereof, which may be based on complementary metal-oxide-semiconductor (CMOS) light direction microchips or otherwise. Integrated circuits may generally involve one or more electronic circuits integrated along a semiconductor substrate to form one or more chips or microchips. Integrated circuits may include sensors, such as gyrocompasses, magnetometers, and optical or image sensors. An LDD microchip is one example of a sensor generally formed as an integrated circuit. The basic function of an LDD microchip is to measure the photo-differential between two identical photodiodes on either side of on on-chip wall for motion capture applications or other various applications.

Figure 1A:
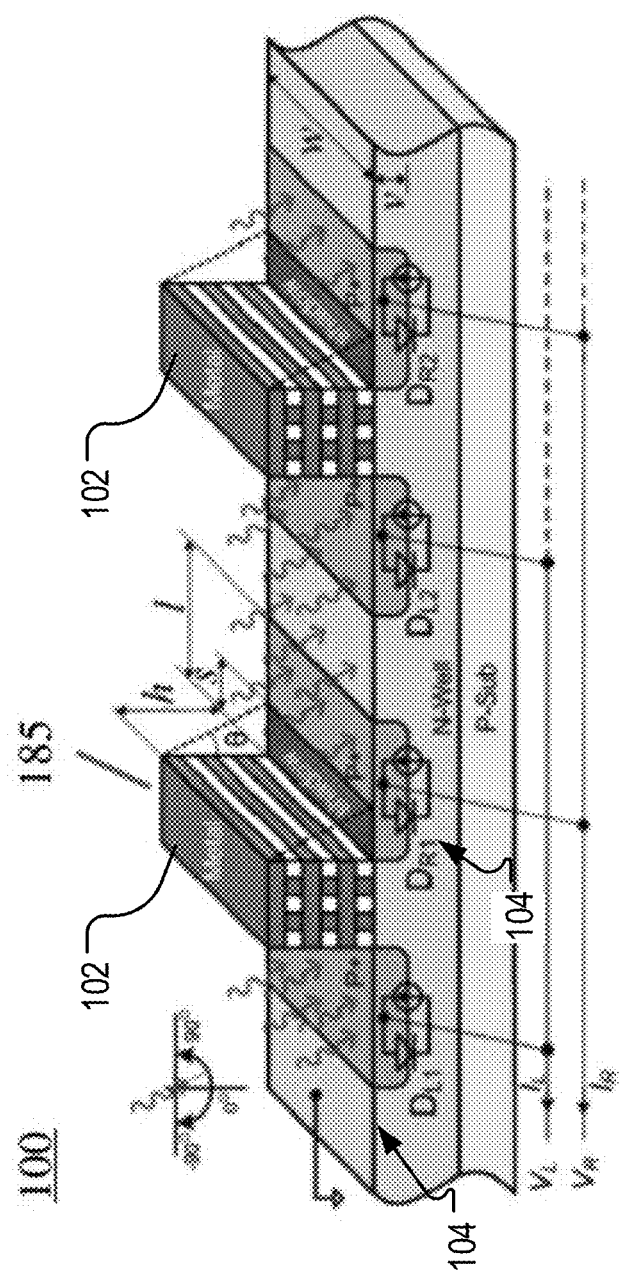
FIG. 1A is an illustration diagram of an exemplary light-direction detection device or chip, according to some embodiments of the present disclosure.
Figure 1B:
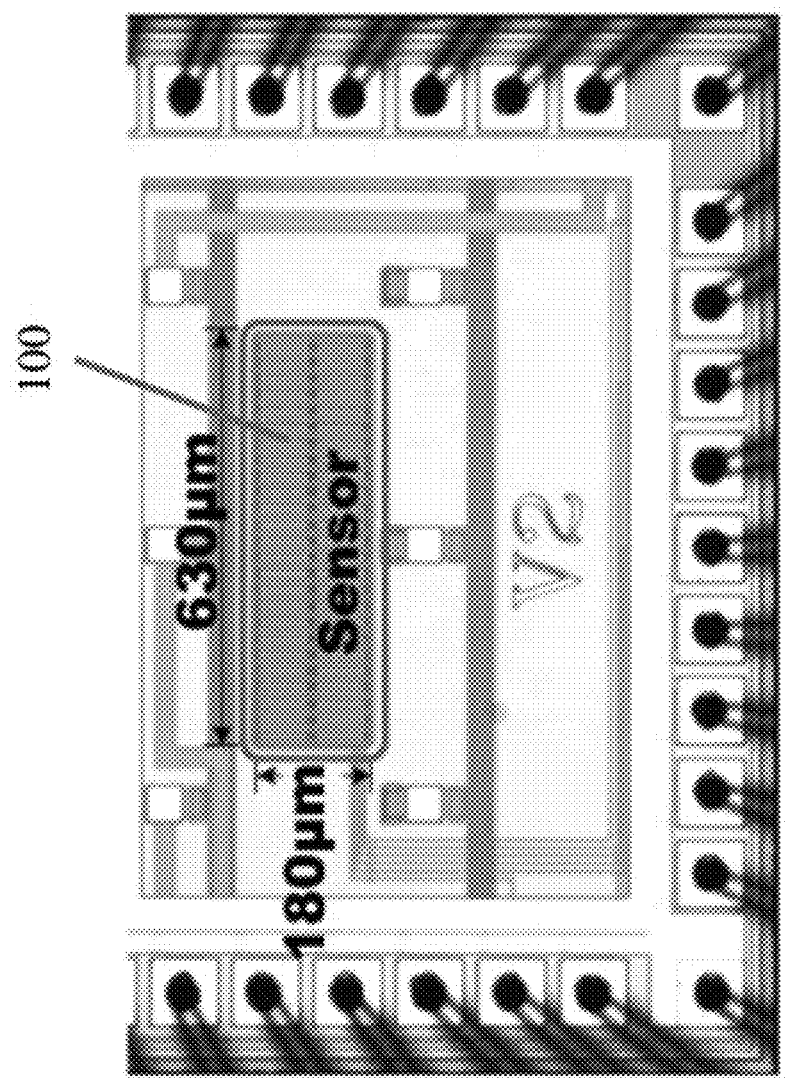
FIG. 1B is a top view of an exemplary light-direction detection microchip or electrical device mounted on a Complementary Metal Oxide Semiconductor (CMOS) chip, according to some embodiments of the present disclosure.

The term "light-direction detection microchip" or light-direction detection device" as used herein, refers to any type of optical sensor configured to detect the direction of light from a light source relative to detecting elements of the chip or device. One exemplary embodiment of such a light-direction detection microchip is discussed in "On-chip sensor for light direction detection", by Hongyi Wang, Tao Luo, Hongjiang Song, and Jennifer B. Christen, Optics Letters 38, 4554 (2013) incorporated herein by reference. FIGS. 1A and 1B provide illustration of the Wang device. The general functionality of the particular light-direction detection embodiment illustrated in FIGS. 1A and 1B is best described by Wang in paragraph [0040]—[t]he sensor consists of 50 basic cells or units connected in parallel. FIG. 1A shows the structure of two basic cells. The essential feature of this sensor is created by stacking predetermined layers of metal or other materials, contacts, and vias available in the process to create predetermined structures such as on-chip walls or optical baffles 102 (which may be referred to herein as "structures"). Two identical photodiodes 104 are located on opposite sides of the wall 185, and the predetermined structures or optical baffles in combination with the pairs of photodiodes 104 generally form "light-direction detection (LDD) units." When the light comes from directly above the wall 185, the two photodiodes are illuminated equally and produce the same currents. When the light comes from one side above the wall 185, the wall 185 blocks part of the light from the opposite photodiode, which therefore produces less current than the other photodiode. The difference of these two currents depends on the angle of the incident light. It is possible to calculate the angle based on these two currents. In other words, as a light source at least partially illuminates a given LDD unit defining a photodiode pair and some predefined structure, the given LDD unit accommodates measurement of the photo-differential between the photodiodes of the LDD unit on either side of the predefined structure to determine light direction of the light source and an associated angle along a plane corresponding to the LDD unit; which may be useful for motion capture applications or other various applications.

Figure 1C:
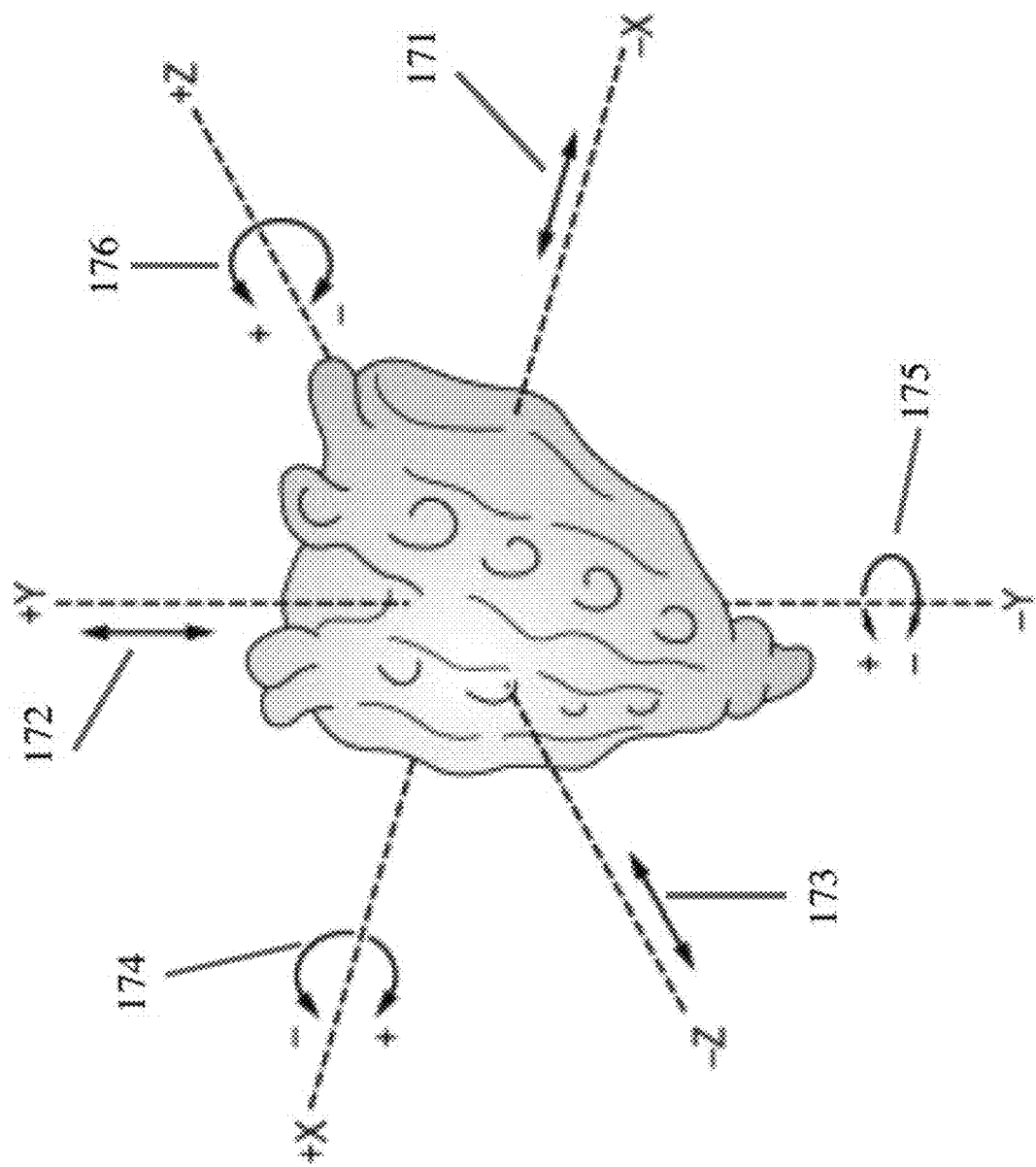
FIG. 1C is a diagram showing 6 degrees of freedom of motion for an object, according to some embodiments of the present disclosure.

The term "six degrees of freedom (6 DoF)," as used herein, refers to six potential movements made by a body in space. FIG. 1C illustrates this motion as: side-to-side movement 171 (along the x-axis); up and down movement 172 (along the y-axis); forward and backward movement 173 (along the z-axis); turning about an x-axis movement 174 pitch); turning about a y-axis movement 175 (yaw); and turning about a z-axis movement 176 (roll) (From A suspensory system for the sacrum in pelvic mechanics: biotensegrity. S M Levin, in Movement, Stability & Lumbopelvic Pain (Second Edition), 2007. Found online at https://www.sciencedirect.com/topics/medicine-and-dentistry/six-degrees-of-freedom, last visited Feb. 8, 2019).

The present disclosure may relate to a camera-less optical motion-capture system (200). Wearable sensors may measure six degrees of freedom (6 DoF) of motion of the object to which they are attached. This may be made possible by placing light emitting diode (LED) lights, in groups or as single light sources, around a room, for example Each LED array may be controlled (e.g., by a computer system) to flash in a particular pattern with other individual LEDs or groups of LEDs in a particular pattern (e.g., circular, spiral or rectilinear). A particular group of LEDs may include two, three, four, or greater numbers of LEDs. The light source of a single LED or LED array may be estimated as a point source. By presenting lights that flash in linear arrangements, and utilizing LDDs as described herein, the angular relationship between light source and sensor may give additional data on 6 DoF of the motion of the sensor. By increasing the number of lights flashed at a specific location, the distance from the light source to the sensor may be calculated.

In some embodiments, the system may include a light source located directly on a 6 DoF sensor. In some embodiments, the camera-less motion-capture system may be hybridized by combining it with a camera-based motion-capture system measuring only 3 DoF. Hybridizing the camera-less system with a camera system for motion capture may be made possible by hardware or software additions that enable serial flashes of LED rings that may surround each motion-capture camera and typically flash simultaneously with the shutter of the camera. With the camera LED rings flashing in a serial sequence, sensors may compute 6 DoF relative to statically mounted cameras. With patterned flashing of the LED on the 6 DoF sensor, an identifying signature of each sensor may be transmitted to the cameras, and the sensors' 3 DoF positions may be constructed in the standard motion-capture process. Hybridizing the camera-less system with a camera-based system may give resiliency to the data by adding redundancy and double checks on at least the computed 3D sensor position portion of the results.

Figure 2:
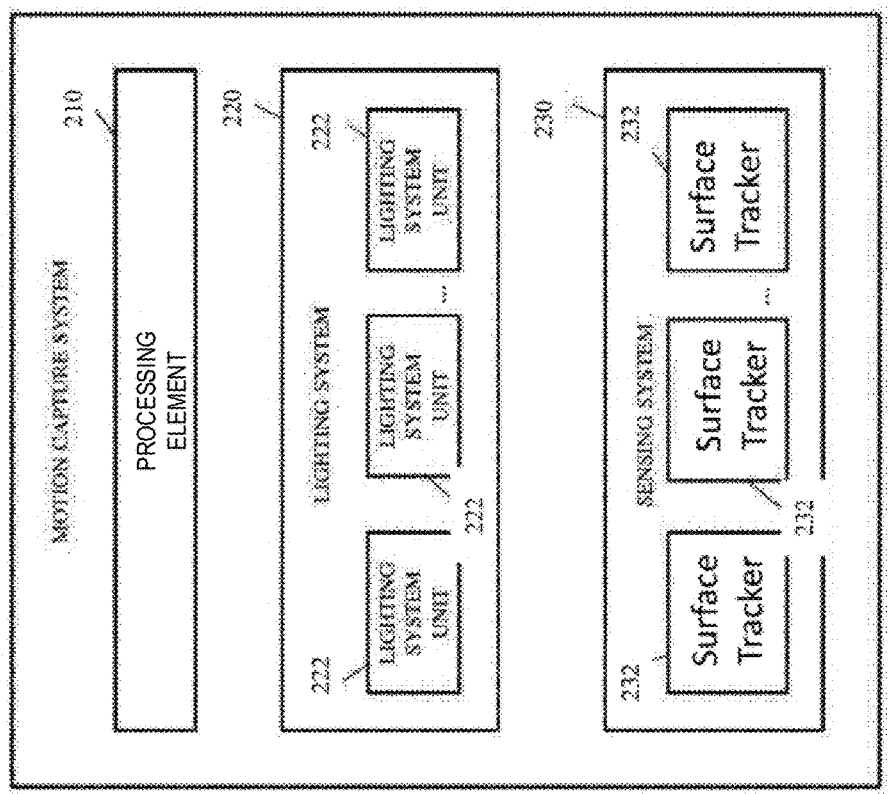
FIG. 2 is a simplified block diagram of an exemplary motion capture system which may apply embodiments of a light-direction detection device described herein.

Referring to FIG. 2, a block diagram of a motion-capture system 200 (which may be devoid of a camera) is shown, which is one exemplary application for implementing embodiments of a light-direction detection (LDD) microchip (e.g., 302 in FIG. 3A), according to some embodiments of the present disclosure. In some embodiments, the system 200 includes a processing element 210, a lighting system 220 and a sensing system 230. The processing element 210 may include any number of processors, microprocessors, controllers, computing devices, on-chip processing units, and/or combinations thereof, and may control the operation of the lighting system 220 and collect data from the sensing system 230. The processing element 210 may further calculate motion or position data of a target based on the collected data. It should be appreciated that the processing element 210 may encompass any number of devices or components that assist with processing of data acquired from the sensing system 230 and the lighting system 220, or otherwise. In some embodiments for example, any number of the LDDs described herein may handle individually or collectively LDD and motion-detection processing functionality described herein.

The lighting system 220 may include one or more lighting system units (LSUs) 222 which may be controlled by the processing element 210 to flash in a known sequence alone or in clusters of LSUs as close as physically possible as adjacent pairs, triads, quads, or greater numbers. While FIG. 2 shows three LSUs, a person of ordinary skill in the art would understand that fewer or more LSUs can be used in some embodiments of the present disclosure and that the particular number of LSUs may be selected based on the requirements for a given application.

The sensing system 230 may include one or more motion/surface trackers 232 which may determine the light intensity at its surface and send readings to the processing element 210 where the angle of incidence and motion can be calculated. The sensing system 230 may include any number of motion trackers 232. While FIG. 2 shows 3 motion trackers, a person of ordinary skill in the art would understand that fewer or more motion trackers can be used in some embodiments of the present disclosure and that the particular number of motion trackers image be selected based on the requirements for a given application.

The lighting system 220 may include a number of lighting system units (LSUs) 222 connected the processing element 210 or any number of computing devices, with wires or wirelessly, and configured to emit light. In some embodiments, the number of the LSUs may be between four and one hundred or more. Each LSU 222 may have a wide angle of light dispersion (>180 degree hemispherical) and may be arranged such that its light saturates a rectangular volume or area within which motion capture of movement may occur. The wide angle of light dispersion from an LSU 222 may enable motion capture by motion trackers located near the walls of the room. The LSUs 222 may emit light in the spectrum from violet to infrared (e.g., having a wavelength of 400 nm to 1.2 mm). Each discrete LSU may include a number of LEDs, Wi-Fi, digital communication equipment, a battery or some combination of these elements. In some embodiments, the number of LEDs may be 40 or more. The powering of all or a select number of LEDs on each LSU may be controlled by the processing element 210 to illuminate with a specific duration and frequency. Each discrete LSU may include means to communicate with the sensors using one way Light Fidelity (LiFi) data transfer, by coding data into the pulsing of the LED activation.

Exemplary LDD Microchip Embodiments

Referring to FIG. 3A, an electrical device 300 is shown, which may be implemented as part of the motion/surface tracker 232 of the system 200 or implemented for any other suitable application. In general, the electrical device 300 includes an embodiment of at least one light-direction detection (LDD) microchip ("chip") 302 or sensor defining a substrate 303 and any number of predefined structures 304 formed along the substrate 303 proximate to pairs of photodiodes 305, with at least some portions of the photodiodes 305 and the structures collectively forming one or more LDD units 306. The LDD units 306 (shown as LDD units 306A-306D) of the chip 302 may accommodate detection, at two optically isolated points, of the intensity of a light from a light source (e.g., lighting system unit 222), to generate a current signal (e.g., associated with plane 310C related to LDD unit 306C) representing the photodiode differential and proportional to the intensity of the light, and the current signal may be transmitted to the processing element 210 or some computing device. It should be appreciated that the structures 304 may include walls or baffles, but may also be formed in layers, may be fully light-occluding and/or partially transparent or opaque, and otherwise take on variations of such sub-embodiments. As further shown, the LDD chip 302 may include at least one infrared light-emitting diode (IRED) 308.

One or more of the structures 304 defined by the LDD chip 302, and photodiode (305) pairs may collectively form the LDD units 306, which may include any number or portion of the structures 304, and the LDD units 306 may be formed linearly across the substrate 303 of the LDD chip 302. The LDD units 306 may be formed along the LDD chip 302 in arrays, which can range in numbers of 1 to 50 or more, and may also comprise 0.11 square millimeters or other dimensions. In general, the LDD chip 302 functions by measuring the shadow effect. In some aspects, these measurement features of the LDD chip 302 are achieved by stacking metal layers, contacts, and vias available in the chip manufacturing process to form the predefined structures 304 as e.g., on-chip walls as optical baffles, such that the structures 304 are arranged in predetermined areas along the substrate 303 relative to pairs of the photodiodes 305, to form any number of the LDD units 306. At least one of the LDD units 306 may be formed to measure light direction in one plane normal and orthogonal to the structures 304. The angle measures as a zero differential when the light comes from directly above a given structure 304 because the two photodiodes 305 arranged along the given structure 304 are illuminated equally and produce the same currents. When the light direction is from one side above the given structure 304, the wall blocks part of the light to the opposite photodiode 305, which produces less current than the other photodiode 305. The difference between these two currents depends on the angle of the direction of a light produced by a light source passing along the given LDD unit 306. As such, from this differential, one can calculate the angle in one plane, zero at perpendicular, and positive and negative in opposite directions, to parallel with the surface of the LDD chip 302.

Known LDD chips are deployed to measure in one-direction only; i.e., known LDD microchips achieve a measurement accuracy of 1.8° degrees over 120° in one plane. This angular measurement precision may be increased with commercial integrated-circuits processes and by implementing the improved design of the LDD microchip 302 described herein and shown in FIG. 3A. In the embodiment shown, the LDD chip 302 includes a minimum of two LDD units 306 such that measurement of light direction is possible in two orthogonal planes. In the example shown, the LDD chip 302 includes four different LDD units 306, labeled LDD units 306A-306D. It should be appreciated that the LDD chip 302 configuration shown is non-limiting, such that a mere two LDD units 306 may be formed to achieve the multiple plane light-direction detection functionality described herein, or any number of LDD units 306.

The transverse plane of the LDD microchip 302 shown may be known as the XY plane. As indicated, it is believed that known LDD microchips are limited to light direction in one plane (called X,Z plane). Yet, it is technically advantageous to measure light direction in two directions (2D); i.e., in at least two planes referred to as the X direction in the XZ plane and Y direction in the YZ plane. In the example shown, each of the LDD units 306 accommodates LDD along different planes corresponding to the position and configuration of a given LDD unit 306. Specifically, the LDD unit 306A provides LDD along a plane 310A, the LDD unit 306B provides LDD along a plane 310B, the LDD unit 306C provides LDD along a plane 310C, and the LDD unit 306D provides LDD along a plane 310D. In some aspects, one may take at least half or a portion of the LDD units 306 of a given LDD microchip (e.g., of FIG. 1B) and rotate them 90° degrees such that light direction detection is possible in two orthogonal planes.

Utilizing multiple LDD units 306 as shown and described may allow output by the LDD chip 302 of a plurality of signals; each of the plurality of signals corresponding to LDD along one of the planes 310 corresponding to a given LDD unit 306. In some embodiments, a 16-bit digitization of the photocurrent differential signal may be utilized. The ability to distill the principle direction of a light source from the XY coordinate system of the LDD microchip 302 is believed to be advantageous. This may be accomplished by implementing the chip 302 with multiple LDD units 306 as shown, and by averaging, or summing the photo-differential signals produced by each of the LDD units 306 or employing any other such means through processing on-board the LDD microchip 302 as adjunct or accessory micro circuitry or other means. The resultant measurement of light direction, along multiple planes 310 relative to a known coordinate system, may provide an advantageous feature for the described LDD microchip 302, and a multi-channel digital-to-analog converter (DAC) may be included to manage the data output. In some embodiments, the improved LDD microchip 302 includes or may be employed with the addition of the capacity to digitize photo-differential output data of each LDD unit 306 with a 16-bit or 32-bit Analog to Digital (A/D) converter up to 4 channels of recorded photo-differential minimum, and a signal amplifier device to enhance the photo-differential signal.

Referring to FIG. 3B, an additional possible feature of the LDD microchip 302 may relate to the potential of implementing LDD units 306 with at least a partial stepped "staggered" or "zig-zag" configuration defined by on-chip walls 320 of the structures 304. In other words, photodiodes 305 may be positioned on either side of a predefined structure 304 with stepped walls 320 a LDD such that additional planes of LDD measurement is possible. These "extra" planes of measurement may allow refining of the true resultant direction in 2D relative to a local coordinate system of the device 300. In these embodiments, as a CMOS process or other similar manufacturing process, the structures 304 and walls 320 may be formed along the substrate 303, by way of vias and walls, in two orthogonal directions, and an approximation of linear walls 320 along the main diagonals may be defined by the structures 304 as shown. These walls 320 defined by the structures 304 may be fabricated as a combination of X and Y steps at the highest resolution the fabrication method allows. These stepped walls 320 may be "pixilated" with discrete blocks of metal wall structure forming linear wall sections. And, if the measurement of an array of LDD units 306 along two main diagonals is possible, it is contemplated to arrange 4 LDD units 306 or arrays in a square layout enabling 4 simultaneous direction measurement capacities (two orthogonal directions and two principle diagonals), each with 16-bit digitized output. Light interaction on the pixilated zig zag may be explored and account for reflections off the wall on the un-shadowed side. Accordingly, with 4 independent functional light direction detecting planes (provided by 4 LDD units 306), the farthest off a main measurement direction is half of 45°. Measuring at full plane at zero and at 90°, the walls 320 accommodate measurement of a full plane at 45° and 135°. In this manner, like a compass, we can read north to south, east to West, but also get a direct bearing on NE-SW, and NW-SE. Even if the zig-zag walls 320 have larger maximum error in light direction detection capability as the two principle planes with linear walls it is still of value especially when light direction is say nearly NE, where it is 45° to each principle, but exactly in the middle of the main measurement of that zig zag wall and stepped photodiodes.

Figure 3C:
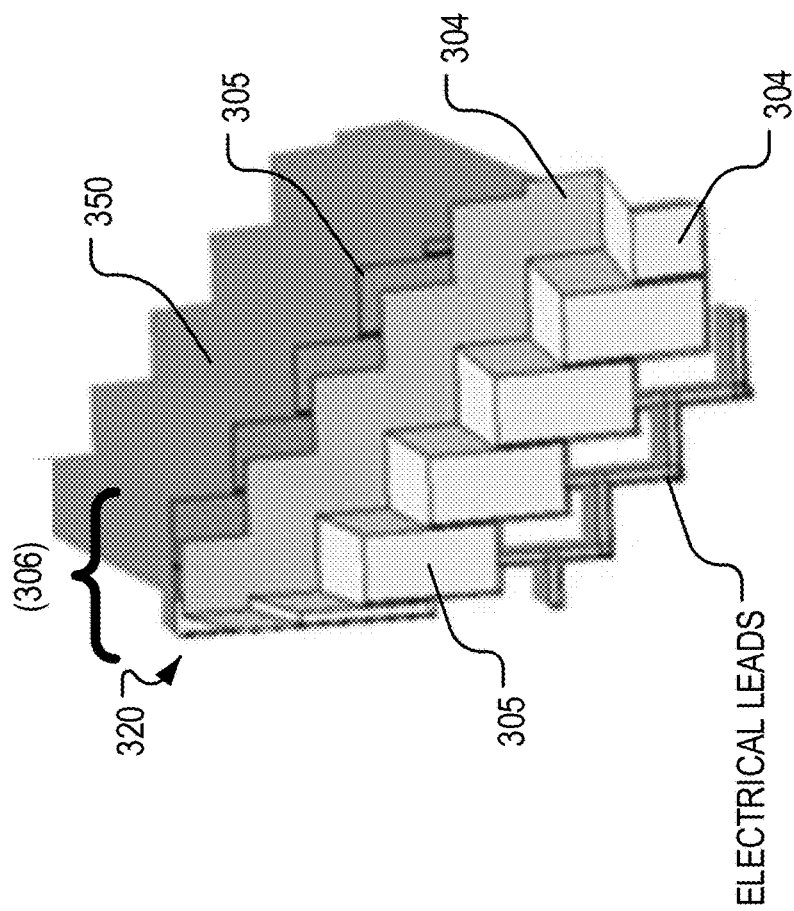
FIG. 3C is an enhanced view of the embodiment of FIG. 3B with a light from a light source illuminating a portion of the LDD chip shown and producing a shadow along one side.

FIG. 3C demonstrates an exemplary shadow 350 produced by a light source as light passes along/over the LDD unit 306 shown. When one portion of the structure 304 is fully shaded, the complimentary opposite side structure portion 304 has a zero photo differential, and the walls 320 may be leveraged to create more accurate measurement capability on the single improved LDD microchip 302.

Additional sub-features of the LDD microchip 302 and other embodiments are contemplated. For example, in some embodiments, the improved LDD microchip 302 may include a light angle measurement sensor that utilizes photoconduction and may include a light emitter that utilizes electro-luminescence with a rapid alternating operation mode (>100 kHz). In some embodiments, the LDD microchip 302 can create a dual functionality in the microchip such that it can alternate between emitting light (acting as an infrared light emitting diode or IRED) and measuring light direction (acting as a photodiode), but by way of a sufficiently small package with multi-plane Light Angle Measurement and an adjacent IRED; which may suffice for implementing motion capture functionality. Any configuration of the LDD units 306 may result in determining the resultant direction to a light from the origin of a fixed surface of a measuring device with known principle orientation (X, Y). In some embodiments, at least one of several possible integrated circuits may be added to the LDD chip 302, including: a signal amplifier, a 16-bit analog-to-digital converter (ADC), a digital signal processing unit (DSP), a memory, a radio frequency (RF) circuit for two-way communication, and a wireless induction system, and processing capacity to read and decode incoming LiFi signal data.

In some embodiments, the improved LDD microchip includes or may be employed as part of an overall package with the capacity to emit infrared light from the microchip from an onboard Light Emitting Diode (IRED). In this manner, a motion capturing system may employ this improved LDD microchip and work to its full potential when each microchip can alternate function between IR emission and IR light angle measurement. To achieve this dual function of the improved LDD it is contemplated to at least put an infrared light emitting diode (IRED) adjacent to the LDD arrays on the microchip. However, it is contemplated to explore the possibility of using the photodiodes in the LDD arrays as both measurement devices excited by light, and as light emitters powered with current. It is further contemplated to have the photodiodes on the improved LDD microchip able to alternate between acting as a light angle measurement sensor that relies on photoconduction and as a light emitter that relies on electro-luminescence with a rapid switching between operation modes (>100 kHz).

In some embodiments, the improved LDD microchip includes or may be integrated with a 2-way RF communications device for reading the LDD array data and signaling the power cycle of the onboard IR light source (IRED), and wireless power induction coils.

In some embodiments, the improved LDD microchip includes a baked-on plastic lens to increase measurement range from 110° to 200° (noting that any number of methods may be used to affix a lens to a photodetector array/LDD chip). The plastic bubble optic "lens" may also increase viewing angle of emitted light from the IRED from 110° to 200°. Given the 110° (+55° to −55°) angular measurement range of the existing microchips as described, adding a bubble optic or other heat molded lens over the improved LDD microchip may increase the Light Angle Measurement range to 180° or even 200° field-of-view. This design will work exactly as needed as the shadowing effect produces a signal ratio with a linear relationship to the angle of the incident light. This ratio also has good immunity to light intensity, which is helpful for the angle calculation. This photodiode pair arrangement is not susceptible to thermal drift coupled with sensitivity to the intensity of the incident light. This improved LDD microchip can be created using the 0.5 μm or the smaller 0.18 μm CMOS process for smaller maximum error results when measuring light angle. It is contemplated that there may be too much optical scattering.

Accordingly, it is further contemplated to design an IR filter overlaid onto a refractive single plane of glass or glass hemisphere or bubble optic that takes 110 viewing angle up to 200 that also is the described IR filter. This IR filter may be a cold filter, or a hot filter as desired.

Figure 5:
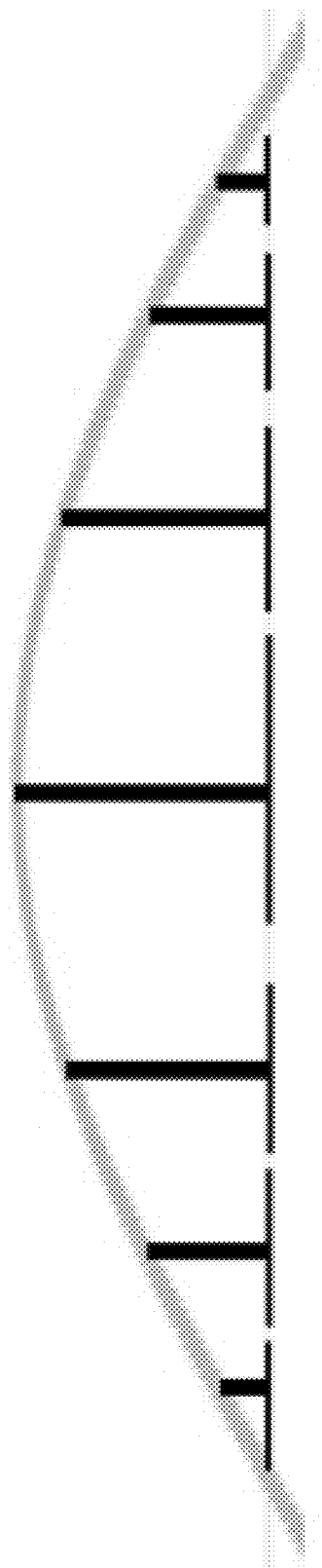
FIG. 5 is an image of a sine wave referenced below in the context of describing the on-chip wall embodiments of the LDD microchip described herein with varying wall heights and inter-wall spacing distributed mathematically.

In some embodiments, the improved LDD microchip may include a functional array of wall heights with lower height walls at each end of the array and a maximal height (per CMOS process) in the center and arrange these varying wall heights with a pixilated SINE wave distribution (FIG. 5). In addition, a low amplitude curve may be used. It is further contemplated to pair shorter walls with narrow photodiode widths, and wider photodiodes with taller walls because of longer shadows cast from taller walls.

In some embodiments, the improved LDD microchip may be integrated with, include, or take the form of a micro-electro-mechanical system (MEMS) or device with the described 2D-LDD on the top surface of a 6 axis inertial measurement unit (IMU) that measures 3 directions of acceleration along 3 orthogonal axes, and 3 rotations around those 3 axis directions, following the right hand rule X, Y, Z. This may offer or accommodate "drift-less" IMU operation. In some embodiments, the improved LDD microchip may be built or mounted onto a commercially available IMU. By pairing the improved LDD microchip with an IMU, a motion capture system may be formed that only needs to do low frequency "corrections" of the IMU drift (>30 Hz but up to 100 Hz).

In some embodiments, the improved LDD microchip may include or be employed with an induction wireless power coil to supply current needed for lighting the IRED, transmitting digitized photo-differential signal(s) via RF, and amplification of the photo-differential signals.

In some embodiments, the improved LDD microchip may include or be integrated with 1D flexible strain gauges that extend in 3 directions from the base of the transverse plane formed by a 6 axis IMU with a 2D-LDD on top. Electrical connection plugs into −Y, strain gauge fibers extend in +X, −X and +Y directions. All 4 I/O structures are at Z=0. In this embodiment, the improved LDD microchip may be formed as a MEMS device with three flexible strain gauges in 3 principle directions so that the $4^{th}$ is the connector to adjacent units, such that a mesh of the improved LDD microchip device can be constructed. This embodiment may be suitable for applications in biomechanics or when the device is arranged along a user. Even in isolation an LDD microchip would have data on whether or not the LDD microchip is on top of a bony landmark protrusion. If a skin movement artifact causes the LDD microchip to slide of the "high-point" of the landmark it is desired to know how much and in which direction. This may be used for studies of movement of the spine/scoliosis research, eventual fitness measurements/sport biomechanics, and the like. The science of biomechanics has always has to deal with skin movement. In Sweden, you can still ethically use "bone-pins" that put a 3D marker on the exterior end of the pin to track skeletal movement. But you need three pins to track the bone in 6 DoF.

In some embodiments, the improved LDD microchip may include or be integrated with a measurement device that delivers 6 DoF and is strain sensitive to quantify skin movement induced slippage away from a landmark. Examples include lateral epicondyle of the femur, spinous process of each vertebra along the spine of an endoskeletal animal. This need for detection of skin movement induced deformation may also be accomplished with a novel octopus-inspired or geko inspired flexible graphene based adhesive material, incorporated into the base of a MEMS implementation of the described LDD microchip.

In some embodiments, the improved LDD microchip may include or be integrated with a vibro-tactile element plate under a 6 DoF IMU and LDD microchip combination that bends longitudinally and laterally, and vibrates longitudinally and laterally. This embodiment may accommodate haptic feedback to be delivered to the user. In this embodiment, it is contemplated to form a device that mimics sensations such as fingernail bending response from manual interaction with objects during everyday tasks by pushing the same type of deflections back into the body as perceptible sensation. Modulating intensity (amplitude) and frequency of oscillation may pattern stimulus to mimic common tasks encountered in everyday life and may accommodate "touch without touching" for interacting with augmented and virtual reality objects.

In some embodiments, the improved LDD microchip may further include or be integrated with a memory onboard the chip for storing its identification number, and short term storage of last measurement before it gets relayed to a base by a radio control. It is further contemplated to record or access its last known 6 DoF (once established). In addition, read-only memory (ROM) may be implemented for linear interpolation of each of the previous multi-plane measurement for estimating subsequent expected angles, and for getting a parallel measurement out of the serial measurements. Any number of memory devices and storage capacities are contemplated and may be integrated with the LDD chip or separately implemented along a shared package or substrate.

Figure 4:
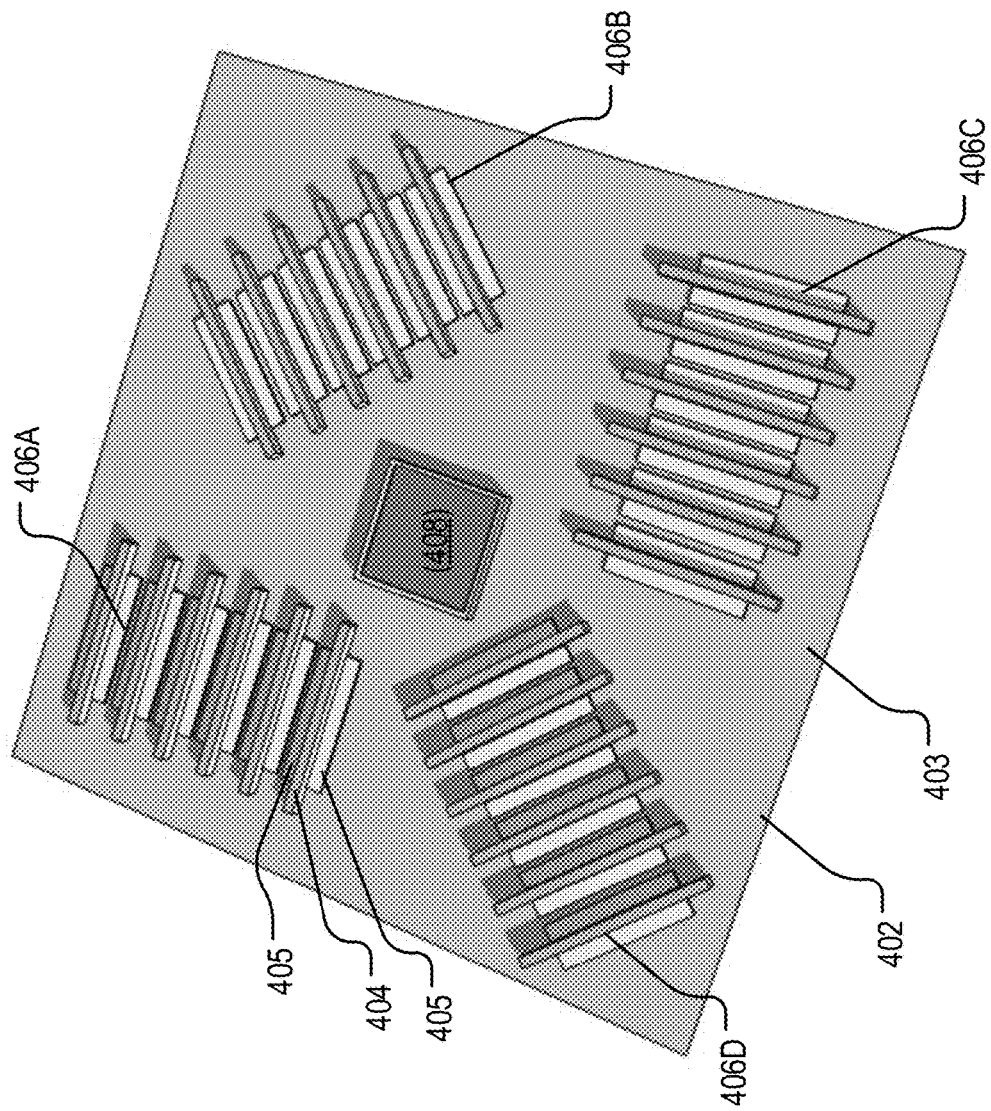
FIG. 4 is a perspective view of one embodiment of an LDD microchip with LDD units having predefined structures or walls formed between photodiode pairs where the walls at least partially extend longer than a length of the photodiode pairs.

Referring to FIG. 4, in some embodiments, an improved LDD microchip 402 is contemplated, similar to the LDD microchip 302. In general, the LDD chip 402 defines a substrate 403 and any number of predefined structures 404 formed along the substrate 403 proximate to pairs of photodiodes 405, with at least some portions of the photodiodes 405 and the structures collectively forming one or more LDD units 406. Further, each of the LDD units 406 (406A-406D) accommodates LDD along different planes corresponding to the position and configuration of a given LDD unit 406. The LDD chip 402 may further include an IRED 408.

In addition, as shown, the predefined structures 404 of each of the LDD units 406 includes on-chip walls with predetermined lengths, with at least some of the predefined structures 404 having lengths equal to or greater than a predetermined threshold between photodiode 405 pairs. It is contemplated, for example, that the walls of a predefined structure 404 of an LDD unit 406 may be longer than the photodiode 405 on each side of the predefined structure 404. It is further contemplated to add length to each wall at each end of the wall beyond the photodiode equal to the base length (adjacent side) of a right triangle, with a wall height X (opposite side), the angle is at least 55 (the measureable range of the wall/photodiode pair) in the main measurement direction, but when 2D light direction is coming in at 55 degrees in the orthogonal direction while also being between 0 and 55 in the primary measurement direction of that LDD unit 406. The maximum angle may be 60 instead of 55: at angle of 60, or Tan 60=opposite/adjacent or height/base. In this manner, these walls of the predefined structures 404 may extend or may be generally formed such that plane measurement is not contaminated by out of plane light directions.

Figure 6:
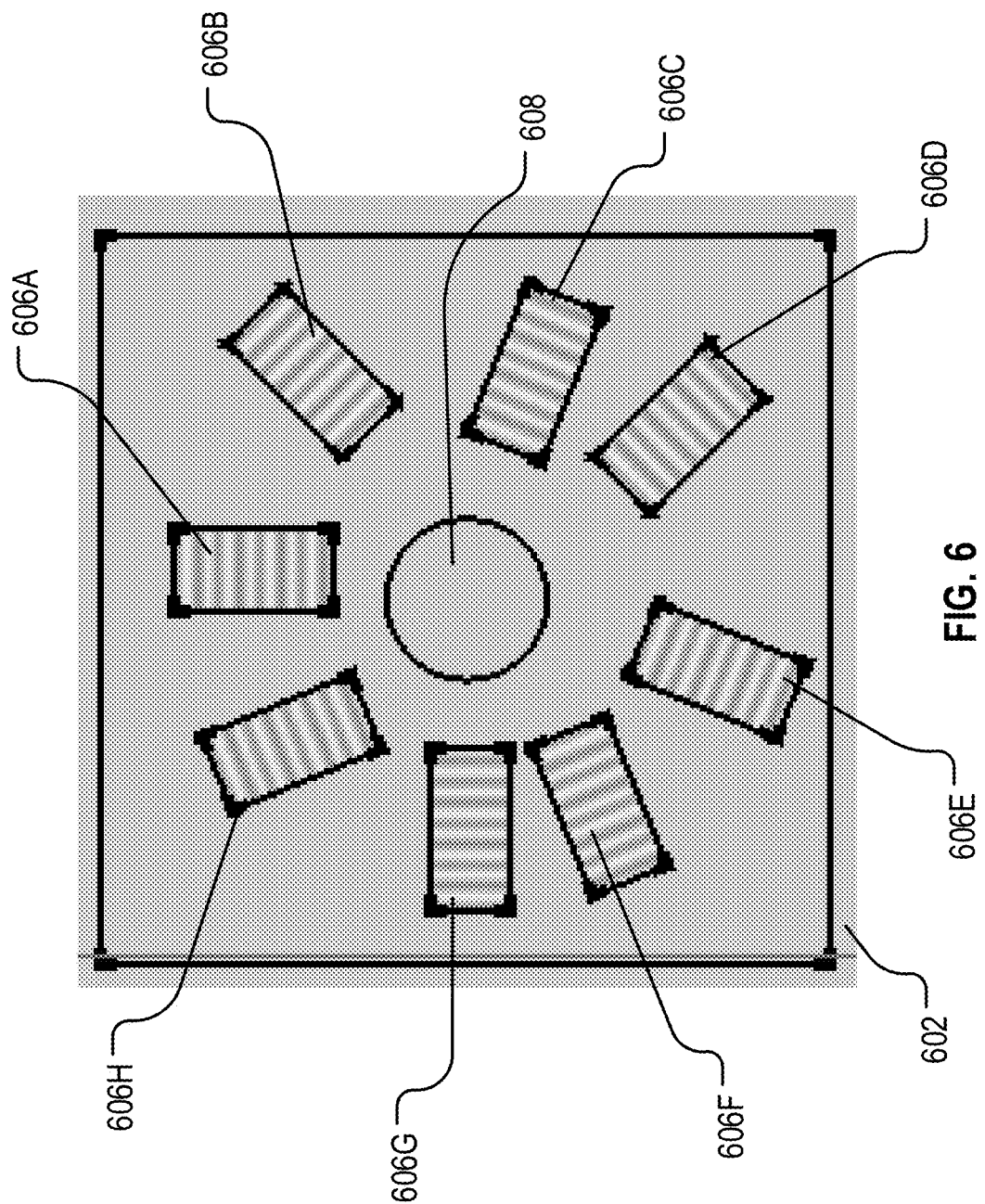
FIG. 6 is an illustration of another embodiment of an LDD device that accommodates light direction detection in two or more orthogonal planes with an infrared light-emitting diode (LED) positioned along a center portion of the device.
Figure 7:
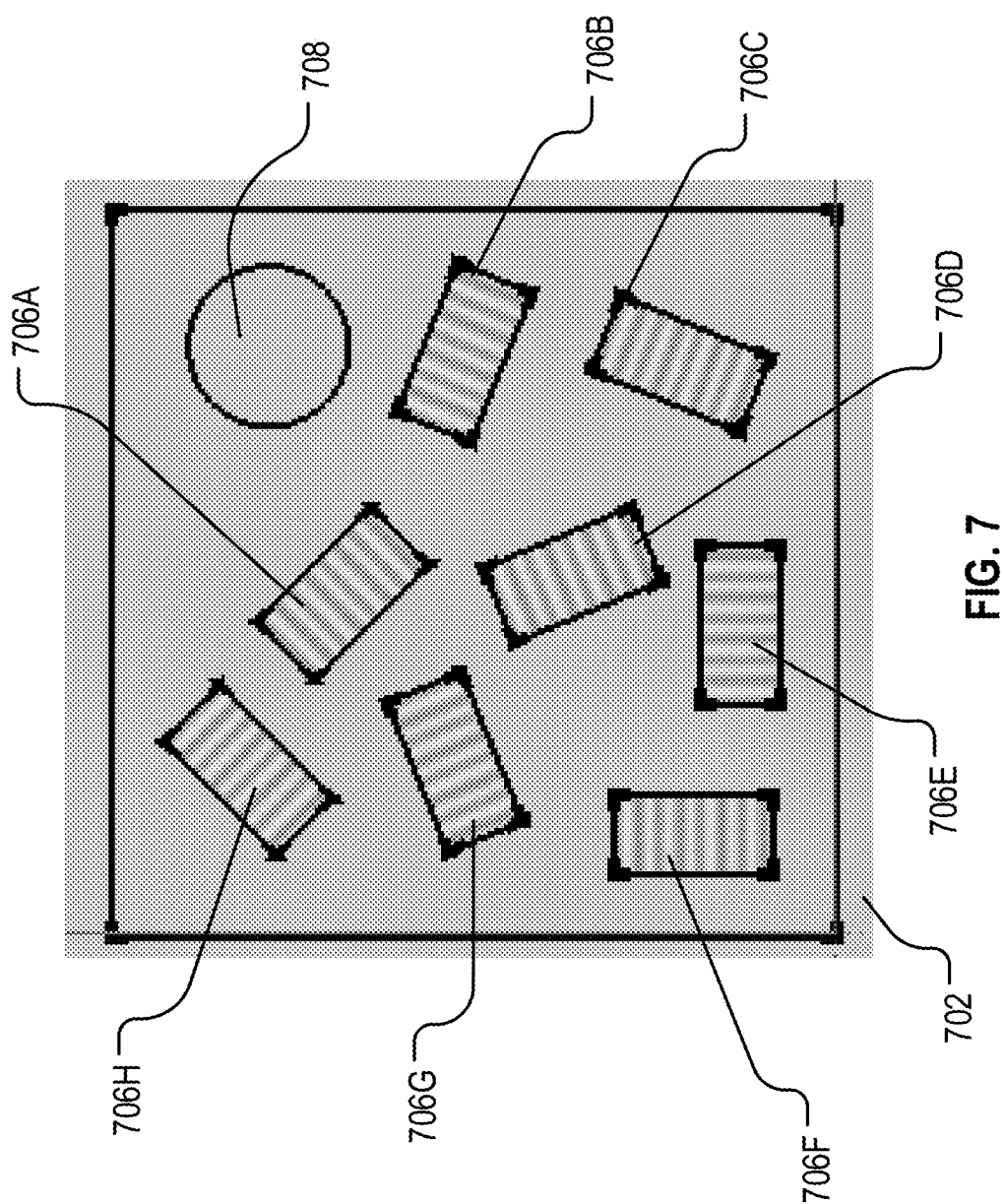
FIG. 7 is an illustration of another embodiment of an LDD device that accommodates light direction detection in two or more orthogonal planes with an infrared light-emitting diode (LED) positioned along a corner of the device.
Figure 8:
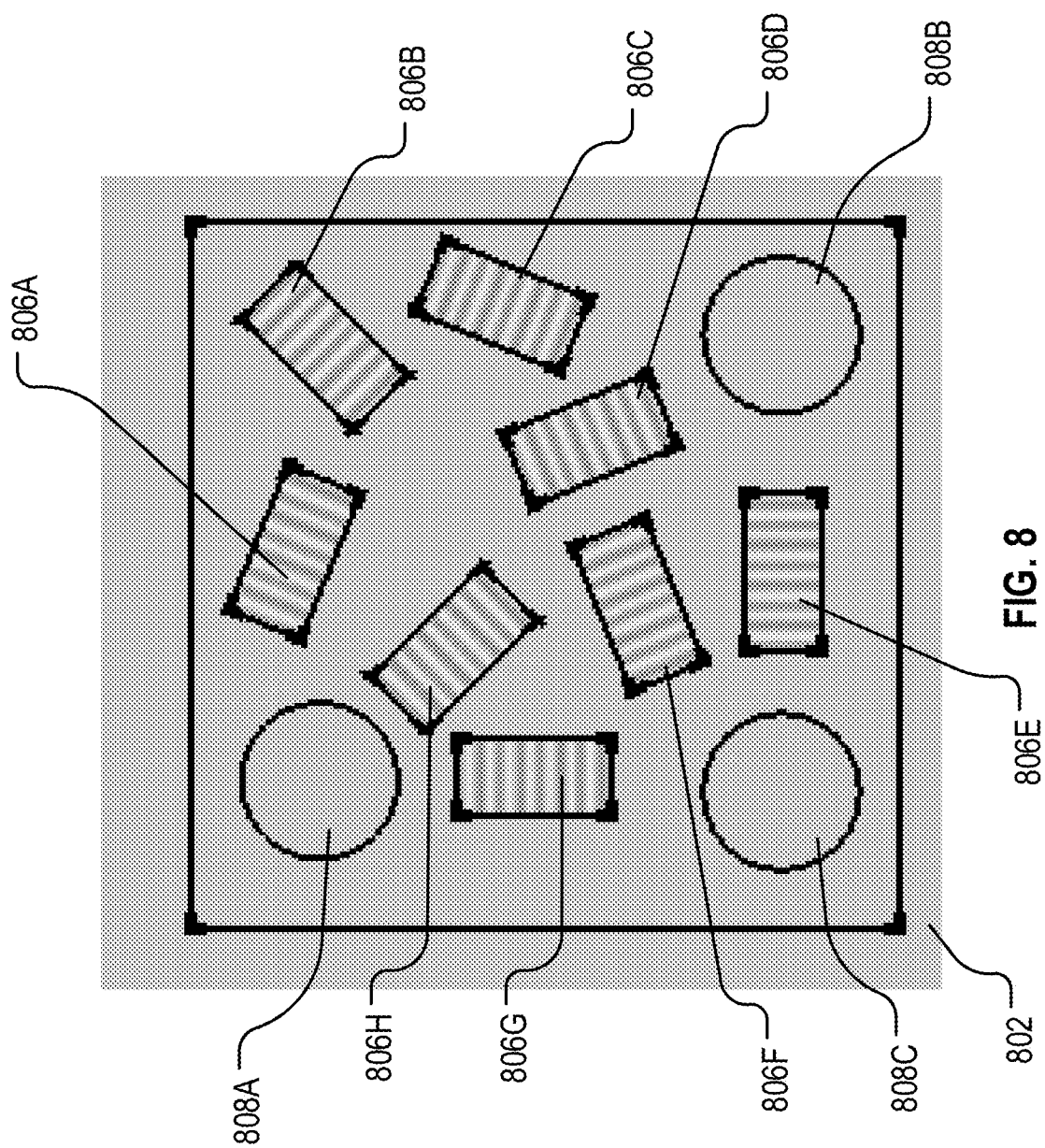
FIG. 8 is an illustration of another embodiment of an LDD device that accommodates light direction detection in two or more orthogonal planes with three infrared LEDs positioned along corners of the device as shown.

FIGS. 6-8 illustrate different embodiments of an LDD chip with different configurations, arrays, or layouts of LDD units. In these embodiments, the chips include photodiode pairs with a wall between arranged in arrays in pi over 8 sections on the chip surface angled from one eighth pi to pi. In other words, each of the chips shown includes 8 LDD units with one or more of an infrared LED (IRED) positioned along the chip. These LDD/IRED layouts may be optimized in length, width, and arrangement (spacing). Basic lateral and vertical layouts include 45 degree and 135 degree plane layouts: up 1 over 1 and down 1 over 1 "zig-zag" steps. The layout of the chips may also include configurations for LDD units associated with LDD along planes 22.5 degrees or up 2 over 1, 67.5 degrees or up 1 over 2, 112.5 degrees or down 1 over 2, and 157.5 degrees or down 2 over 1 steps.

Figure 9:
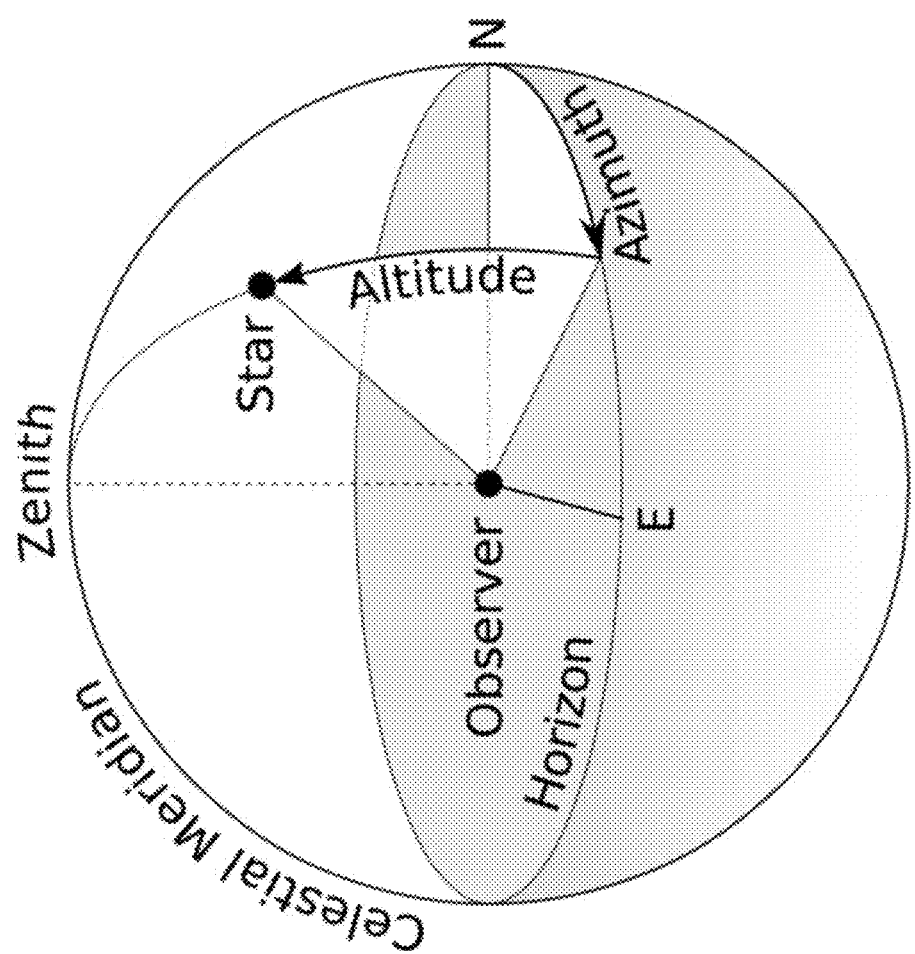
FIG. 9 is an illustration related to a star-gazing example referenced to support novel concepts described herein.

In some embodiments, the LDD units of an LDD chip may be arranged in groups of 8 arranged in sections of pi: pi*1/8 (22.5 degrees), pi*2/8 (45 degrees), pi*3/8 (67.5 degrees), pi*4/8 (90 degrees), pi*5/8 (112.5 degrees), pi*6/8 (135 degrees), pi*7/8 (157.5 degrees), pi*8/8 (180 degrees). It is desirable and contemplated to measure differentials of light direction on these different facing arrays of LDD units and perform onboard signal reduction to output a single pair of angles. For illustration, this concept relates to the example of star gazing for perspective and navigation (see Azimuth and Altitude in FIG. 9). With stargazing, an observer only needs two angles to measure direction (azimuth and altitude); and by comparison, the present disclosure contemplates generating a total output of a single pair of angles based on signals generated from each LDD unit along the chip relating to LDD along different planes.

With each of the embodiments of FIGS. 6-8, the signals generated from LDD provided by the eight LDD units can be reduced, via on-chip processing or by a separate computing device, from the eight signals corresponding to LDD into a pair of angles. In addition, a 3-D unit vector direction with an origin at the sensor center, or transformed Local Coordiante System relative to the sensor center can be provided based on photo differential comparisons between each of the signals from the LDD units.

More particularly, referring to FIG. 6 for example, another embodiment of an LDD chip 602 is illustrated that accommodates light direction detection in two or more orthogonal planes with an infrared light-emitting diode (LED) 608 positioned along a center portion of the LDD chip 602. In this embodiment, the LDD chip 602 includes a plurality of LDD units 606, denoted as LDD units 606A-606H, configured for LDD direction along different unique planes.

Referring to FIG. 7, an illustration of another embodiment of an LDD chip 702 is shown that accommodates light direction detection in two or more orthogonal planes, using LDD units denoted as 706A-706H, and an infrared light-emitting diode (LED) 708 positioned along a corner of the LDD chip 702. Referring to FIG. 8, an illustration of another embodiment of an LDD chip 802 is shown that accommodates light direction detection in two or more orthogonal planes using LDD units 806A-806H, with three infrared LEDs 808 positioned along corners of the LDD chip 802 as shown.

Exemplary Computing Device:

Referring to FIG. 10, a computing device 1200 is illustrated which may be implemented to perform at least some functions of the processing element 210 and may be configured, via one or more of an application 1211 or computer-executable instructions, to execute functionality described herein. More particularly, in some embodiments, aspects of the motion-capture via LDD methods herein may be translated to software or machine-level code, which may be installed to and/or executed by the computing device 1200 such that the computing device 1200 is configured to execute functionality described herein. It is contemplated that the computing device 1200 may include any number of devices, such as personal computers, server computers, hand-held or laptop devices, tablet devices, multiprocessor systems, microprocessor-based systems, set top boxes, programmable consumer electronic devices, network PCs, minicomputers, mainframe computers, digital signal processors, state machines, logic circuitries, distributed computing environments, and the like.

The computing device 1200 may include various hardware components, such as a processor 1202, a main memory 1204 (e.g., a system memory), and a system bus 1201 that couples various components of the computing device 1200 to the processor 1202. The system bus 1201 may be any of several types of bus structures including a memory bus or memory controller, a peripheral bus, and a local bus using any of a variety of bus architectures. For example, such architectures may include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computing device 1200 may further include a variety of memory devices and computer-readable media 1207 that includes removable/non-removable media and volatile/nonvolatile media and/or tangible media, but excludes transitory propagated signals. Computer-readable media 1207 may also include computer storage media and communication media. Computer storage media includes removable/non-removable media and volatile/nonvolatile media implemented in any method or technology for storage of information, such as computer-readable instructions, data structures, program modules or other data, such as RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information/data and which may be accessed by the computing device 1200. Communication media includes computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. For example, communication media may include wired media such as a wired network or direct-wired connection and wireless media such as acoustic, RF, infrared, and/or other wireless media, or some combination thereof. Computer-readable media may be embodied as a computer program product, such as software stored on computer storage media.

The main memory 1204 includes computer storage media in the form of volatile/nonvolatile memory such as read only memory (ROM) and random access memory (RAM). A basic input/output system (BIOS), containing the basic routines that help to transfer information between elements within the computing device 1200 (e.g., during start-up) is typically stored in ROM. RAM typically contains data and/or program modules that are immediately accessible to and/or presently being operated on by processor 1202. Further, data storage 1206 in the form of Read-Only Memory (ROM) or otherwise may store an operating system, application programs, and other program modules and program data.

The data storage 1206 may also include other removable/non-removable, volatile/nonvolatile computer storage media. For example, the data storage 1206 may be: a hard disk drive that reads from or writes to non-removable, nonvolatile magnetic media; a magnetic disk drive that reads from or writes to a removable, nonvolatile magnetic disk; a solid state drive; and/or an optical disk drive that reads from or writes to a removable, nonvolatile optical disk such as a CD-ROM or other optical media. Other removable/non-removable, volatile/nonvolatile computer storage media may include magnetic tape cassettes, flash memory cards, digital versatile disks, digital video tape, solid state RAM, solid state ROM, and the like. The drives and their associated computer storage media provide storage of computer-readable instructions, data structures, program modules, and other data for the computing device 1200.

A user may enter commands and information through a user interface 1240 (displayed via a monitor 1260) by engaging input devices 1245 such as a tablet, electronic digitizer, a microphone, keyboard, and/or pointing device, commonly referred to as mouse, trackball or touch pad. Other input devices 1245 may include a joystick, game pad, satellite dish, scanner, or the like. Additionally, voice inputs, gesture inputs (e.g., via hands or fingers), or other natural user input methods may also be used with the appropriate input devices, such as a microphone, camera, tablet, touch pad, glove, or other sensor. These and other input devices 1245 are in operative connection to the processor 1202 and may be coupled to the system bus 1201, but may be connected by other interface and bus structures, such as a parallel port, game port or a universal serial bus (USB). The monitor 1260 or other type of display device may also be connected to the system bus 1201. The monitor 1260 may also be integrated with a touch-screen panel or the like.

The computing device 1200 may be implemented in a networked or cloud-computing environment using logical connections of a network interface 1203 to one or more remote devices, such as a remote computer. The remote computer may be a personal computer, a server, a router, a network PC, a peer device or other common network node, and typically includes many or all of the elements described above relative to the computing device 1200. The logical connection may include one or more local area networks (LAN) and one or more wide area networks (WAN), but may also include other networks. Such networking environments are commonplace in offices, enterprise-wide computer networks, intranets and the Internet.

When used in a networked or cloud-computing environment, the computing device 1200 may be connected to a public and/or private network (including, e.g., a LiFi network) through the network interface 1203. In such embodiments, a modem or other means for establishing communications over the network is connected to the system bus 1201 via the network interface 1203 or other appropriate mechanism. A wireless networking component including an interface and antenna may be coupled through a suitable device such as an access point or peer computer to a network. In a networked environment, program modules depicted relative to the computing device 1200, or portions thereof, may be stored in the remote memory storage device.

Certain embodiments are described herein as including one or more modules. Such modules are hardware-implemented, and thus include at least one tangible unit capable of performing certain operations and may be configured or arranged in a certain manner. For example, a hardware-implemented module may comprise dedicated circuitry that is permanently configured (e.g., as a special-purpose processor, such as a field-programmable gate array (FPGA) or an application-specific integrated circuit (ASIC)) to perform certain operations. A hardware-implemented module may also comprise programmable circuitry (e.g., as encompassed within a general-purpose processor or other programmable processor) that is temporarily configured by software or firmware to perform certain operations. In some example embodiments, one or more computer systems (e.g., a stand-alone system, a client and/or server computer system, or a peer-to-peer computer system) or one or more processors may be configured by software (e.g., an application or application portion) as a hardware-implemented module that operates to perform certain operations as described herein.

Accordingly, the term "hardware-implemented module" encompasses a tangible entity, be that an entity that is physically constructed, permanently configured (e.g., hardwired), or temporarily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure the processor 1202, for example, to constitute a particular hardware-implemented module at one instance of time and to constitute a different hardware-implemented module at a different instance of time.

Hardware-implemented modules may provide information to, and/or receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation, and may store the output of that operation in a memory device to which it is communicatively coupled. A further hardware-implemented module may then, at a later time, access the memory device to retrieve and process the stored output. Hardware-implemented modules may also initiate communications with input or output devices.

Computing systems or devices referenced herein may include desktop computers, laptops, tablets e-readers, personal digital assistants, smartphones, gaming devices, servers, and the like. The computing devices may access computer-readable media that include computer-readable storage media and data transmission media. In some embodiments, the computer-readable storage media are tangible storage devices that do not include a transitory propagating signal. Examples include memory such as primary memory, cache memory, and secondary memory (e.g., DVD) and other storage devices. The computer-readable storage media may have instructions recorded on them or may be encoded with computer-executable instructions or logic that implements aspects of the functionality described herein. The data transmission media may be used for transmitting data via transitory, propagating signals or carrier waves (e.g., electromagnetism) via a wired or wireless connection.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

It is believed that the present disclosure and many of its attendant advantages should be understood by the foregoing description, and it should be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it should be understood that these embodiments are illustrative and that the scope of the disclosure is not limited to such embodiments. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. An electrical device for light-direction detection (LDD), comprising:
    a light direction detection (LDD) microchip, including:
        a substrate, and
        a plurality of LDD units formed along the substrate, each of the plurality of LDD units defining a predefined structure positioned between a pair of photodiodes formed along the substrate,
    wherein the LDD microchip accommodates detection for each of the plurality of LDD units, at two optically isolated points, of an intensity of a light from a structured or unstructured light source and generates a current signal representing a photodiode differential proportional to the intensity of the light along more than one plane orthogonal to the predefined structure, and
    wherein the predefined structure of each of the plurality of LDD units includes walls with a stepped configuration and the walls include discrete blocks defining linear wall sections.

2. The electrical device of claim 1, wherein the plurality of LDD units include at least eight discrete LDD units arranged along predefined sections along the substrate in arrays in pi over 8 sections on a surface of the LDD microchip and angled from one eighth pi to pi.

3. The electrical device of claim 1, wherein the predefined structure includes a length greater than a length of the pair of photodiodes to reduce light measurement errors.

4. The electrical device of claim 1, further comprising:
    a processing element, the processing element accessing a plurality of current signals generated from the plurality of LDD units in response to a light from a light source, the processing element further reducing the plurality of current signals to a pair of angles.

5. The electrical device of claim 4, wherein the processing element computes a three-dimensional unit vector direction emanating from at least one originating LDD unit of the plurality of LDD units of the LDD microchip, or other pre-described Local Coordinate System origin.

6. The electrical device of claim 1, wherein the LDD microchip includes an infrared light emitting diode (IRED) for emitting light.

7. The electrical device of claim 6, wherein the LDD microchip is configured with a rapid alternating operation mode such that the LDD microchip alternates between emitting light via the IRED and measuring light direction via a first photodiode and a second photodiode relative to a given LDD unit of the plurality of LDD units.

8. An electrical device for light-direction detection (LDD), comprising:
    a light direction detection (LDD) microchip, including:
        a substrate, and
        a plurality of LDD units formed along the substrate, each of the plurality of LDD units defining a predefined structure positioned between a pair of photodiodes formed along the substrate,
    wherein the LDD microchip accommodates detection for each of the plurality of LDD units, at two optically isolated points, of an intensity of a light from a structured or unstructured light source and generates a current signal representing a photodiode differential proportional to the intensity of the light along more than one plane orthogonal to the predefined structure, the plurality of LDD units of the LDD microchip including a first LDD unit providing LDD along a first plane, and a second LDD unit providing LDD along a second plane different from the first plane, and
    wherein the predefined structure of each of the plurality of LDD units includes walls with a stepped configuration and the walls include discrete blocks defining linear wall sections.

9. The electrical device of claim 8, wherein the plurality of LDD units include at least eight discrete LDD units arranged along predefined sections along the substrate in arrays in pi over 8 sections on a surface of the LDD microchip and angled from one eighth pi to pi.

10. The electrical device of claim 8, wherein the predefined structure includes a length greater than a length of the pair of photodiodes to reduce light measurement errors.

11. The electrical device of claim 8, further comprising:
    a processing element, the processing element accessing a plurality of current signals generated from the plurality of LDD units in response to a light from a light source, the processing element further reducing the plurality of current signals to a pair of angles.

12. The electrical device of claim 11, wherein the processing element computes a three-dimensional unit vector direction emanating from at least one originating LDD unit of the plurality of LDD units of the LDD microchip, or other pre-described Local Coordinate System origin.

13. The electrical device of claim 8, wherein the LDD microchip includes an infrared light emitting diode (IRED) for emitting light.

14. The electrical device of claim 13, wherein the LDD microchip is configured with a rapid alternating operation mode such that the LDD microchip alternates between emitting light via the IRED and measuring light direction via a first photodiode and a second photodiode relative to a given LDD unit of the plurality of LDD units.

15. An electrical device for light-direction detection (LDD), comprising:
- a light direction detection (LDD) microchip, including:
  - a substrate, and
  - a plurality of LDD units formed along the substrate, each of the plurality of LDD units defining a predefined structure positioned between a pair of photodiodes formed along the substrate,
- wherein the LDD microchip accommodates detection for each of the plurality of LDD units, at two optically isolated points, of an intensity of a light from a structured or unstructured light source and generates a current signal representing a photodiode differential proportional to the intensity of the light along more than one plane orthogonal to the predefined structure, the LDD microchip generating a plurality of signals from the plurality of LDD units with each of the plurality of signals corresponding to a given LDD unit of the plurality of LDD units, and
- wherein the predefined structure of each of the plurality of LDD units includes walls with a stepped configuration and the walls include discrete blocks defining linear wall sections.

16. The electrical device of claim 15, further comprising:
- a processing element, the processing element accessing the plurality of signals generated from the plurality of LDD units in response to a light from a light source, the processing element further reducing the plurality of current signals to a pair of angles.

17. The electrical device of claim 16, wherein the processing element sums the photo differential associated with the plurality of signals.

18. The electrical device of claim 16, further comprising a light angle measurement sensor in operable communication with the processing element that utilizes photoconduction and may include a light emitter that utilizes electroluminescence with a rapid alternating operation mode.

* * * * *